US010063188B2

(12) United States Patent
Srinivas

(10) Patent No.: US 10,063,188 B2
(45) Date of Patent: Aug. 28, 2018

(54) LEAKAGE TOLERANT OSCILLATOR

(71) Applicant: Silicon Laboratories Inc., Austin, TX (US)

(72) Inventor: Shail Srinivas, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 146 days.

(21) Appl. No.: 15/140,717

(22) Filed: Apr. 28, 2016

(65) Prior Publication Data

US 2017/0317645 A1    Nov. 2, 2017

(51) Int. Cl.
| H03K 17/00 | (2006.01) |
| H03B 5/36 | (2006.01) |
| H03B 5/24 | (2006.01) |
| H01L 21/00 | (2006.01) |
| H03K 17/06 | (2006.01) |
| H03B 5/34 | (2006.01) |
| H03L 5/02 | (2006.01) |
| H03K 17/693 | (2006.01) |

(52) U.S. Cl.
CPC ............ *H03B 5/24* (2013.01); *H01L 21/00* (2013.01); *H03B 5/34* (2013.01); *H03B 5/36* (2013.01); *H03K 17/063* (2013.01); *H03K 17/693* (2013.01); *H03L 5/02* (2013.01)

(58) Field of Classification Search
CPC .... H03B 5/34; H03B 5/36; H03B 5/24; H03L 5/02; H01L 9/94; G05F 3/24; H03K 17/693; H03K 17/063
USPC ............ 331/158, 116 FE; 327/537, 365, 389
See application file for complete search history.

(56) References Cited

U.S. PATENT DOCUMENTS

| 7,113,018 B2 | 9/2006 | Li et al. |
| 7,304,530 B2 | 12/2007 | Wei et al. |
| 2003/0197552 A1* | 10/2003 | Watanabe ............... G05F 3/245 327/541 |

(Continued)

OTHER PUBLICATIONS

Lee, D., et al., "Gate Oxide Leakage Current Analysis and Reduction for VLSI Circuits," IEEE Transactions on Very Large Scale Integration (VLSI) Systems, vol. 12, No. 2, Feb. 2004, pp. 155-166.

(Continued)

*Primary Examiner* — Arnold Kinkead
(74) *Attorney, Agent, or Firm* — Zagorin Cave LLP

(57) ABSTRACT

A technique for reducing jitter in an oscillating signal generated by an oscillator circuit includes reducing feedback of gate leakage current while increasing electrostatic discharge protection and reducing regulated power supply requirements of the oscillator circuit, as compared to conventional oscillator circuits. A circuit includes a first integrated circuit terminal and a thick gate native transistor of a first conductivity type having a first gate terminal having a first gate thickness. The first gate terminal is coupled to the first integrated circuit terminal. The thick gate native transistor has a first threshold voltage. The thick gate native transistor is configured as a source follower. The circuit includes a second transistor of the first conductivity type having a second gate terminal with a second gate thickness less than the first gate thickness. The second gate terminal is coupled to a source terminal of the thick gate native transistor.

20 Claims, 4 Drawing Sheets

(56) References Cited

U.S. PATENT DOCUMENTS

2014/0118034 A1* 5/2014 Lemkin .................... H03L 5/02
327/143

OTHER PUBLICATIONS

Paek, J.S., et al., "CMOS LNA with Darlington-pair for UWB systems," Electronics Letters, vol. 42, Issue 16, Aug. 2006, pp. 913-914.

* cited by examiner ated circuit terminal. The oscillator circuit may include an amplifier circuit coupled between the first and second integrated circuit terminals. The amplifier circuit may include the thick gate native transistor and the second transistor. The circuit may include a third transistor having a third gate terminal with a third gate thickness greater than the second gate thickness. The third transistor may have a third threshold voltage. The third transistor may be configured as a common source amplifier. The third gate terminal may be coupled to the first integrated circuit terminal.

LEAKAGE TOLERANT OSCILLATOR

BACKGROUND

Field of the Invention

This invention relates to electronic devices and more particularly to generating clock signals for electronic devices.

Description of the Related Art

In general, clock generator circuits are used to generate repetitive oscillating electronic signals for a variety of integrated circuit applications (e.g., local oscillator signals for radio frequency mixers, transmitters for generating carrier waves for radio frequency signal transmission, or transmitters for wireline or optical transmission systems). A clock generator circuit may use a crystal oscillator as an input clock source to a phase-locked loop in order to generate required frequencies for a timing system. Using a crystal or other high-quality resonator ensures that the output clock signal has a target frequency. In general, phase noise performance of the overall clock generation system is determined by phase noise performance of the crystal oscillator for frequencies within the bandwidth of an associated phase-locked loop responsive to the clock signal. Frequency bands of interest for integrated jitter may be determined by overall considerations of the timing system. In those frequency bands, it may be desirable to have the crystal oscillator phase noise response as low as possible. For example, a frequency band of interest for evaluating integrated jitter includes frequency f in the range of 12 kHz≤f≤20 MHz, which is a SONET OC-3 mask for synchronous optical networking.

Referring to FIG. 1, conventional oscillator circuit 100 includes amplifier 106, which includes a forward path of a feedback loop driving output node XB in response to input node XA, input capacitor 110, which has capacitance $C_1$, and output capacitor 112, which has capacitance $C_2$, and feedback resistor 104, which has resistance $R_{FB}$, to form a feedback network from output node XB to input node XA. Local negative feedback via feedback resistor 104 biases amplifier 106 at an appropriate operating point. At the oscillation frequency, the phase lag around the loop is 360°.

Resonator 102 (e.g., a piezoelectric crystal) may be represented by a series RLC network with resistance $R_1$, capacitance $C_3$ and inductance $L_1$, with other parasitic elements such as the parallel capacitance $C_4$ and capacitances $C_{11}$, as illustrated in FIG. 2. Referring back to FIG. 1, oscillator 100 includes two parallel feedback paths from output node XB to input node XA: one through resonator 102 and one through feedback resistor 104. The feedback network formed by resonator 102 is band-pass, i.e., it transmits a band of frequencies on either side of the oscillation or resonance frequency $f_{res}$, with exemplary resonator has a bandwidth that is approximately $f_{res}/(2 \times Q)$, where Q is the quality factor of the resonator. Typical high-quality resonators have bandwidths of approximately a few kHz and only pass signals near the resonance frequency $f_{res}$.

Feedback resistor 104, having a resistance $R_{FB}$, and input capacitor 110 having a capacitance $C_1$, form a low-pass feedback network having a corner frequency of approximately $$\frac{1}{2\pi R_{FB}C_1}.$$

Noise from output node XB and feedback resistor 104 is shaped by that low-pass feedback network. Non-linear mechanisms in the oscillator up-convert that noise to the resonance frequency. Thus, the combination of the low-pass filter and the resonator effectively form an equivalent band-pass filter having a bandwidth of $$\frac{1}{2\pi R_{FB}C_1}.$$

At frequencies greater than the corner frequency, feedback signals (e.g., noise of noise sources at output node XB) and noise due to the feedback resistor $R_{FB}$ decrease at a rate of 20 dB/decade. However, substantial noise energy may remain in a frequency band of interest (e.g., the jitter integration band) if the corner frequency of the low-pass filter is within or near the frequency band of interest. Accordingly, improved techniques for generating clock signals are desired.

SUMMARY OF EMBODIMENTS OF THE INVENTION

In at least one embodiment of the invention, a circuit includes a first integrated circuit terminal and a thick gate native transistor of a first conductivity type having a first gate terminal having a first gate thickness. The first gate terminal is coupled to the first integrated circuit terminal. The thick gate native transistor has a first threshold voltage. The thick gate native transistor is configured as a source follower. The circuit includes a second transistor of the first conductivity type having a second gate terminal with a second gate thickness less than the first gate thickness. The second gate terminal is coupled to a source terminal of the thick gate native transistor. The second transistor has a second threshold voltage. A first magnitude of the first threshold voltage may be less than a second magnitude of the second threshold voltage. The first threshold voltage may have a magnitude of approximately zero volts. A first gate leakage current of the thick gate native transistor may be less than a second gate leakage current of the second transistor. The second gate terminal may be coupled to a low-impedance path to a bias node.

The circuit may include a second integrated circuit terminal coupled to a drain terminal of the second transistor and an oscillator circuit. The oscillator circuit may include a resistor coupled between the first and second integrated circuit terminals. The oscillator circuit may include a first capacitor coupled to the first integrated circuit terminal. The oscillator circuit may include a second capacitor coupled to the second integrated circuit terminal. The oscillator circuit may include an amplifier circuit coupled between the first and second integrated circuit terminals. The amplifier circuit may include the thick gate native transistor and the second transistor. The circuit may include a third transistor having a third gate terminal with a third gate thickness greater than the second gate thickness. The third transistor may have a third threshold voltage. The third transistor may be configured as a common source amplifier. The third gate terminal may be coupled to the first integrated circuit terminal.

The circuit may include a second integrated circuit terminal coupled to a drain terminal of the second transistor and an oscillator circuit. The oscillator circuit may include a first capacitor coupled to the first integrated circuit terminal and a second capacitor coupled to the second integrated circuit terminal. The oscillator circuit may include a resistor coupled between the first integrated circuit terminal and a drain terminal of the second transistor. The oscillator circuit may include an inverter circuit coupled to the resistor. The inverter circuit may include the second transistor and an additional transistor of a second conductivity type having a third gate terminal coupled to the source terminal of the thick gate native transistor. The oscillator circuit may include a feedback resistor coupled between an output of the inverter circuit and the first gate terminal.

The circuit may include an oscillator circuit including the thick gate native transistor and the second transistor. The oscillator circuit may include a resistor coupled to the first gate terminal and a first bias node. The oscillator circuit may include a first capacitor coupled to the first gate terminal of the thick gate native transistor and a source terminal of the second transistor. The oscillator circuit may include a second capacitor coupled to the source terminal of the second transistor and a second bias node.

In at least one embodiment of the invention, a method includes providing a signal, to a circuit including at least one transistor, based on a first signal received from a first integrated circuit terminal by a second circuit comprising a thick gate native transistor of a first conductivity type having a first gate terminal having a first gate thickness. The first gate terminal is coupled to the first integrated circuit terminal. The thick gate native transistor has a first threshold voltage. The thick gate native transistor is configured as a source follower. The at least one transistor has a second threshold voltage having a magnitude greater than a magnitude of the first threshold voltage. The providing may include isolating a second transistor from the first integrated circuit terminal using the thick gate native transistor. The second transistor may have a second gate with a second gate thickness less than the first gate thickness. The second transistor may have a second threshold voltage and the second gate terminal may be coupled to a source terminal of the thick gate native transistor. A first magnitude of the first threshold voltage may be less than a second magnitude of the second threshold voltage and a first gate leakage current of the thick gate native transistor may be less than a second gate leakage current of the second transistor.

The second circuit may be an oscillator circuit and the signal may be a first oscillating signal. The method may further include calibrating the second circuit based on at least one of a duty cycle of a second oscillating signal on the first integrated circuit terminal and a DC voltage level on the first integrated circuit terminal. The calibrating may include measuring at least one of the duty cycle of the second oscillating signal on the first integrated circuit terminal and the DC voltage level on the first integrated circuit terminal. The calibrating may include adjusting a device parameter of at least one of the thick gate native transistor, the second transistor, and the third transistor based on the at least one of the duty cycle of the second oscillating signal on the first integrated circuit terminal and the DC voltage level on the first integrated circuit terminal. The method may include buffering the signal using at least a third transistor having a third gate terminal with a third gate thickness greater than the second gate thickness. The thick gate transistor may have a third threshold voltage. The third transistor may be configured as a common source amplifier. The third gate terminal may be coupled to the first integrated circuit terminal. The first threshold voltage may have a magnitude of approximately zero volts. The second threshold voltage may have a magnitude greater than approximately zero volts. The third threshold voltage may have a magnitude greater than the magnitude of the second threshold voltage.

In at least one embodiment of the invention, a method of manufacturing a circuit includes forming a first integrated circuit terminal. The method includes forming a thick gate native transistor of a first conductivity type having a first gate terminal having a first gate thickness. The first gate terminal is coupled to the first integrated circuit terminal. The thick gate native transistor has a first threshold voltage. The thick gate native transistor is configured as a source follower. The method includes forming a second transistor of the first conductivity type having a second gate terminal with a second gate thickness less than the first gate thickness. The second gate terminal is coupled to a source terminal of the thick gate native transistor. The second transistor has a second threshold voltage. The thick gate native transistor and the second transistor may be formed in an oscillator circuit configured to generate an oscillating signal on the first integrated circuit terminal. The method may include calibrating the oscillator circuit based on at least one of a duty cycle of the oscillating signal on the first integrated circuit terminal and a DC voltage level on the first integrated circuit terminal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
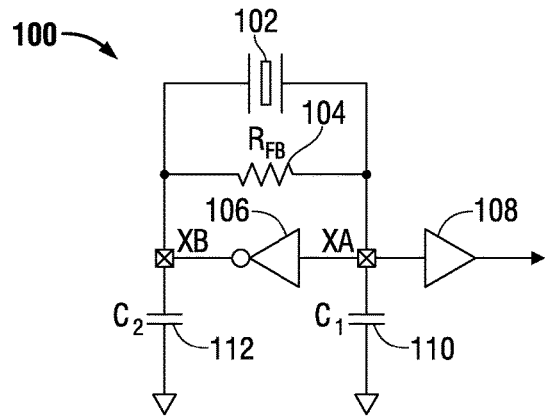
FIG. 1 illustrates a circuit diagram of a conventional Pierce oscillator circuit.
Figure 2:
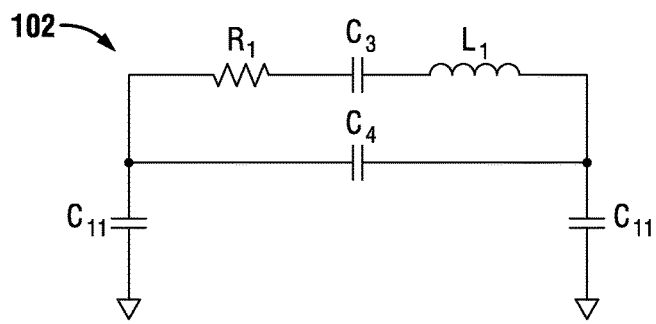
FIG. 2 illustrates a model of a resonant mode of a resonator of FIG. 1.
Figure 3:
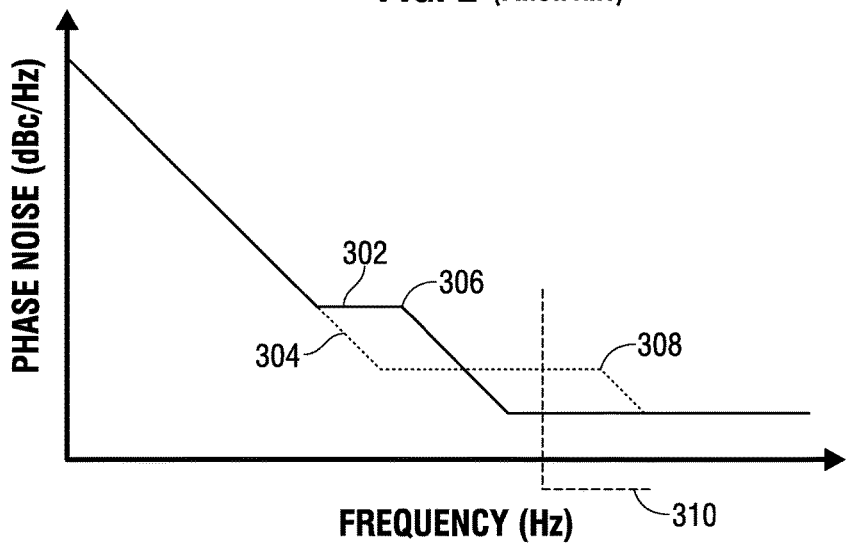
FIG. 3 illustrates exemplary phase noise as a function of frequency curves for the feedback network of the Pierce oscillator of FIG. 1.

Techniques for reducing jitter in a target frequency band of an oscillating signal generated by an oscillator circuit include reducing the corner frequency of a low-pass feedback network of the oscillator circuit. Referring to FIGS. 1 and 3, to reduce jitter in the oscillating signal, an oscillator circuit is designed to substantially reduce the corner frequency of the feedback network including feedback resistor 104 and input capacitor 110 (e.g., from corner frequency 308 of curve 304) to sufficiently attenuate those noise sources below the start of the band for integrated jitter (e.g., as illustrated by the phase noise curve 302 and corner frequency 306 below frequencies in range 310).

Figure 4:
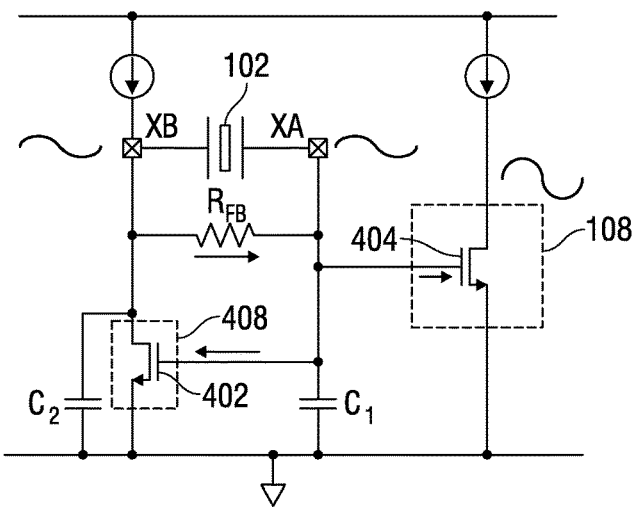
FIG. 4 illustrates an exemplary implementation of the Pierce oscillator circuit of FIG. 1.

In general, an oscillator circuit may have a Pierce oscillator topology (e.g, FIG. 4), an inverter oscillator topology (e.g., FIG. 5), a Colpitts oscillator topology (e.g., FIG. 6), or other suitable oscillator topology. The oscillator circuits of FIGS. 4, 5, and 6 each include an amplifier having a conventional amplifier topology, e.g., a common source amplifier (e.g., amplifier 408 of FIG. 4), a common drain amplifier (e.g., transistor 802 of FIG. 6), an inverter, or an inverter with an R-C delay stage at the output (e.g., delay stage including resistor $R_2$ of FIG. 5). The oscillator circuit may include a buffer (e.g., buffer 108, which may include device 404 configured as a common source amplifier, as illustrated in FIG. 4) that further amplifies the clock waveform at the input of the amplifier to create the final output clock provided to other circuitry. In the inverter topology of FIG. 5, the oscillator amplifier formed by p-type transistor 502 and n-type transistor 504 also functions as the buffer and a separate buffer is not included.

Figure 5:
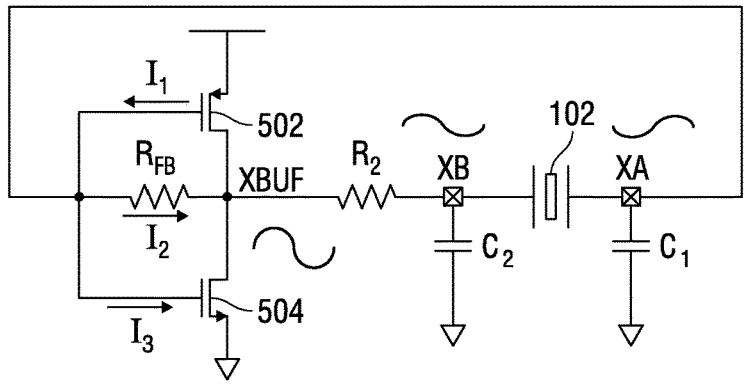
FIG. 5 illustrates a circuit diagram of a conventional inverter oscillator circuit.
Figure 6:
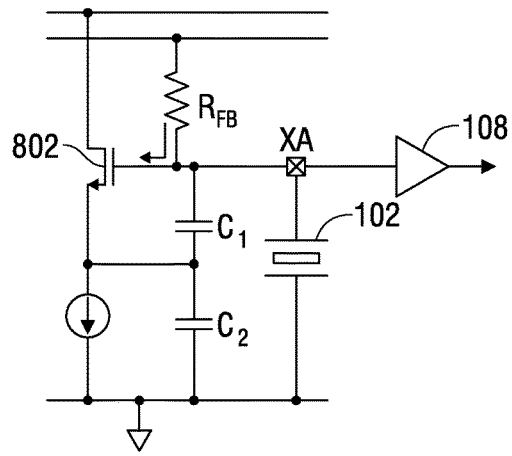
FIG. 6 illustrates a circuit diagram of a conventional Colpitts oscillator circuit.

Referring to FIGS. 4-6, a reduction of the corner frequency of the oscillating signal generated by an oscillator circuit may be achieved by increasing the resistance-capacitance product of the feedback network (e.g., $R_{FB}C_1$ product). In general, feedback resistance $R_{FB}$ should be many times (e.g., at least five times) greater than the equivalent parallel resistance of resonator 102 at resonance (e.g., approximately a few kilo-Ohms (kΩ)) to reduce impacting the quality factor of the oscillator circuit, which is indicative of the ability of the amplifier to sustain oscillation and not degrade the frequency stability of the output clock signal. Accordingly, a typical minimum value of feedback resistance $R_{FB}$ is approximately a few tens of kΩ, which does not reduce the feedback resistor noise contribution to a level that would result if the corner frequency of the oscillator circuit was reduced further (e.g., much less than a start of the jitter integration band, which is approximately 12 kHz). Since an increase of capacitance $C_1$ consumes substantially more area than a comparable increase of feedback resistance $R_{FB}$, capacitance $C_1$ may be determined by loading specifications for resonator 102, and increases to $C_1$ may degrade negative resistance of the oscillator circuit, techniques for reducing the corner frequency of the low-pass feedback network of the oscillator circuit may be limited to increasing the feedback resistance $R_{FB}$. However, note that an increase to feedback resistance $R_{FB}$ of an oscillator circuit increases a noise contribution of the feedback resistor within the decreased corner frequency $$\frac{1}{2\pi R_{FB} C_1}.$$

As manufacturing technology reduces the minimum gate length of a standard transistor (e.g., from 180 nm to 55 nm) in a low-voltage CMOS manufacturing process (i.e., low supply voltage process, e.g., a process for CMOS integrated circuits operable in response to a 1.7V external supply and a 1V internal $V_{DD}$), associated gate oxide thicknesses also decrease (e.g., from 4-5 nm to 2 nm) to achieve target voltage and performance specifications. However, the thinner gate oxides of standard transistors in such processes cause increased (e.g., exponential increase of approximately 15 times) leakage current from the transistor channel to the gate and through the gate oxide. While leakage (e.g., gate leakage and sub-threshold voltage leakage) from any load capacitor switches (if required) may be reduced to negligible levels by using conventional low leakage switch topologies, gate leakage currents from the transistors coupled to input node XA cannot be easily removed or compensated without using thick gate transistors. Replacing standard transistors with thick gate transistors compromises low voltage operation and/or high frequency operation.

The increases in feedback resistance $R_{FB}$ discussed above for achieving target jitter performance by an oscillator circuit, increase amplification of the gate leakage noise current, thereby degrading the jitter performance of the oscillator. In addition, the leakage current also causes a large voltage drop across feedback resistance $R_{FB}$, which may affect the oscillator operating point. In addition, standard transistors having thin gate oxides of such low power processes are susceptible to damage from electrostatic discharge from the integrated circuit terminal, which may be an integrated circuit contact pad or other integrated circuit terminal coupled to a high impedance path. The integrated circuit terminal may be coupled to an off-chip resonator (e.g., a piezoelectric crystal) via an integrated circuit contact pad or may be coupled to an on-chip resonator via a high impedance path (e.g., a microelectromechanical system (MEMS) resonator).

An integrated circuit contact pad (e.g., bonding pad) is an area to which the integrated circuit is accessed external to the integrated circuit die (e.g., a bond wire is soldered between a bonding pad and a chip pin or a probe needle contacts the integrated circuit via the contact pad). Electrostatic discharge occurs when charge stored in the human body or other device is discharged to the gate of a transistor on contact or by static induction. Typical electrostatic discharge protection circuitry includes one or more large devices coupled in parallel that are able to sustain substantial current (e.g., clamping diodes, which may include diode-tied PMOS transistor coupled to $V_{DD}$ and diode-tied NMOS transistor coupled to ground). However, the buffer that operates on the oscillating signal at input node XA may be sensitive to input resistance, which precludes the use of secondary electrostatic discharge protection, e.g., an additional series resistance, that is otherwise recommended for all thin-oxide devices coupled to a pad. This problem becomes more severe as CMOS process technology line widths decrease and device oxides become thinner. Use of typical secondary electrostatic discharge protection (e.g., series resistors) coupled to the integrated circuit contact pads of an oscillator circuit would increase the jitter and may be excluded, but results in a design that is susceptible to damage from electrostatic discharge and may become a limiting factor for electrostatic discharge protection compliance.

Accordingly, a leakage tolerant oscillator circuit facilitates an increase in feedback resistance $R_{FB}$ to achieve target jitter performance specifications for a circuit manufactured using a target high-speed, low voltage integrated circuit process technology. Since the difference of the gate leakage currents (e.g., current $I_2$, which includes a component based on the difference between current $I_1$ and current $I_3$ flows through the feedback resistor to node XBUF, the inverter architecture of FIG. 5 may be more gate leakage tolerant than the circuit topology of FIG. 4. However, for high performance applications, eliminating gate leakage entirely may be crucial to reducing jitter and may provide improved electrostatic discharge reliability.

Figure 7:
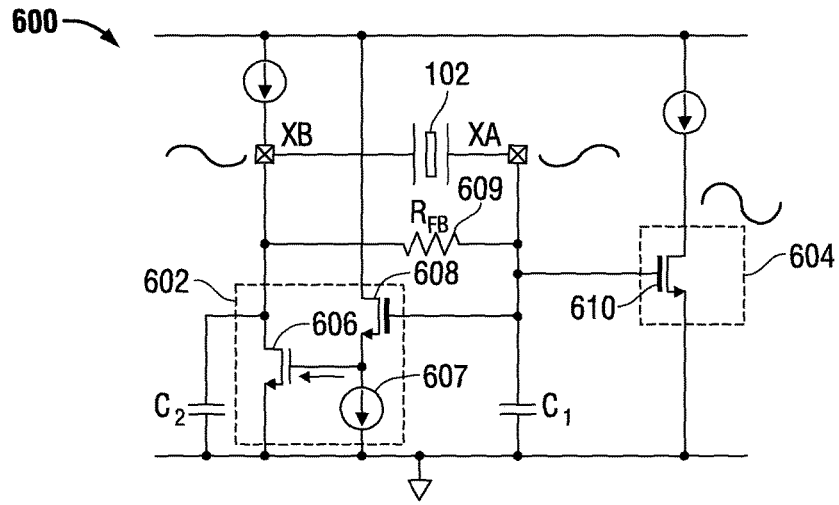
FIG. 7 illustrates a circuit diagram of a leakage-tolerant Pierce oscillator circuit consistent with at least one embodiment of the invention.

Referring to FIG. 7, oscillator circuit 600 includes thick gate native transistor 608, which is configured as a source follower, in series with standard transistor 606, which is configured as a common source amplifier. Thick gate native transistor 608 isolates standard transistor 606 of amplifier 602 from input node XA and provides a low impedance path (e.g., a path having an impedance value that is at least one or more orders of magnitude less than the impedance value of the feedback path) for gate oxide leakage current of standard transistor 606. Isolating the gate of standard transistor 606 from feedback resistor 609 removes the gate oxide leakage current from the feedback path, thereby facilitating an increase of feedback resistance $R_{FB}$ to achieve target oscillator jitter performance for a low power supply voltage.

In an exemplary low-voltage integrated circuit manufacturing process, a native transistor is a type of transistor that is intermediate between an enhancement mode transistor (i.e., a transistor that is off at a zero gate-to-source voltage) and a depletion mode transistor (i.e., a transistor that is on at a zero gate-to-source voltage). The native transistor has nearly zero threshold voltage. The native transistor may be an undoped transistor having a first conductivity type (e.g., n-type) manufactured directly in a substrate having a second conductivity type (e.g., p-type), whereas standard transistors are manufactured in a doped well that is formed in a substrate. The low-voltage manufacturing process may provide transistors having gate terminals formed using a thin oxide layer (i.e., standard transistors) or transistors having gate terminals formed using a thick oxide layer (i.e., thick gate transistor). Those thick gate transistors are intended for interfacing to integrated circuit contact pads. However, those thick gate transistors may be slower transistors. A native transistor may be manufactured with oxide having a thin-gate oxide thickness (i.e., native transistor) or a thick oxide (i.e., thick gate native transistor). The native transistor is typically larger than a standard transistor (e.g., the native transistor may have a minimum length that is 5-20 times the minimum length of a standard transistor), and typically has a lower transconductance than a standard transistor. The native transistor and the thick gate native transistor have threshold voltages with magnitudes less than a threshold voltage of a standard transistor. In general, a native transistor has a threshold voltage of approximately 0V. The threshold voltage of the standard transistor has a magnitude less than the threshold voltage of a thick gate transistor. The thick gate native transistor has a threshold voltage with a magnitude less than a threshold voltage of a thick gate transistor. In an exemplary low-voltage integrated circuit manufacturing process, the threshold voltage of the standard transistor is at least 100 mV less than the threshold voltage of the thick gate transistor (e.g., the threshold voltage of the standard transistor is approximately 350-400 mV and the threshold voltage of the thick gate transistor is approximately 600-650 mV). Accordingly, the thick gate native transistor provides protection from high voltages without a substantial associated increase in threshold voltage, making it suitable for use in low power circuits that are coupled to an integrated circuit pad terminal.

Referring to FIG. 7, a technique for reducing jitter in an oscillator output signal generated by an oscillator circuit, includes forming amplifier 602 of oscillator circuit 600 using thick gate native transistor 608, which is configured as a source follower and is coupled in series with standard transistor 606. Any gate leakage current from standard transistor 606 flows to a bias node (e.g., a positive voltage supply node, negative voltage supply node, or ground node) through thick gate native transistor 608 or low impedance path 607 and not through feedback resistor 609. Thick gate native transistor 608 isolates standard transistor 606 from input node XA, thereby providing improved electrostatic discharge protection to standard transistor 606, as compared to the oscillator of FIG. 4. Referring back to FIG. 7, in at least one embodiment of oscillator circuit 600, buffer 604 includes thick gate transistor 610, which isolates other circuitry implemented using standard transistors (e.g., transistors having thin gate oxide width) from input node XA. In addition, the oscillating signal at input node XA may be directly used (i.e., without buffering) as a modulating sinusoidal signal. Accordingly, oscillator circuit 600 does not include any standard transistors having thin gate oxide directly coupled to input node XA, thereby increasing the electrostatic discharge protection of an integrated circuit using oscillator circuit 600. Note that thick gate transistor 610 has a higher threshold voltage than other transistors, but the configuration of oscillator circuit 600 of FIG. 7 provides a signal that generates a gate-to-source voltage that is sufficient to turn on thick gate transistor 610. Amplifier 602 includes thick gate native transistor 608 in series with standard transistor 606. That series combination of different transistor types requires less voltage headroom than an amplifier including a single thick gate transistor, thereby facilitating use of a lower voltage regulated power supply (e.g., reduced by approximately 200 mV) than a solution that uses a single thick gate transistor. The series combination of different transistor types has improved electrostatic discharge protection over amplifiers including a single standard transistor and facilitates low power supply operation while reducing jitter in the output oscillating signal.

Figure 8:
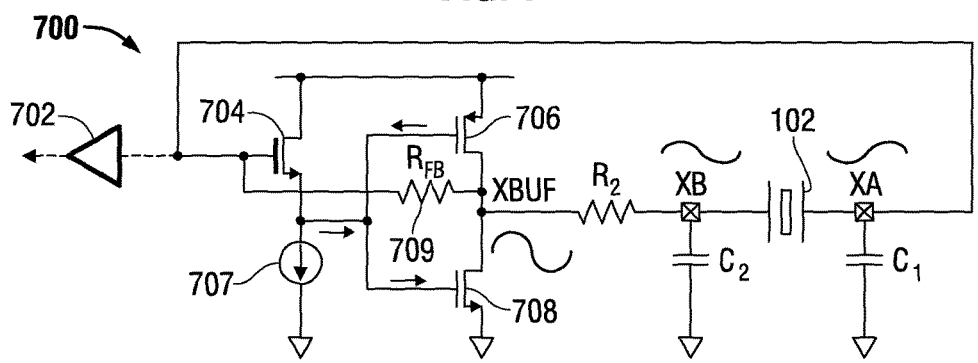
FIG. 8 illustrates a circuit diagram of a leakage-tolerant inverter oscillator circuit consistent with at least one embodiment of the invention.

The technique for reducing jitter in a clock generator output signal may be applied to other circuit topologies. For example, referring to FIG. 8, thick gate native transistor 704 is configured as a source follower coupled in series with the inverter formed by standard transistor 706 (p-type) and standard transistor 708 (n-type). Accordingly, thick gate native transistor 704 isolates the inverter from input node XA, thereby increasing electrostatic discharge protection. Any gate leakage current from standard transistor 706 or standard transistor 708 flows to a bias node through thick gate native transistor 704 or through low impedance path 707 and not through feedback resistor 709. Buffer 702, which is optional, may be formed from one or more thick gate transistors or the output may be tapped off at node XBUF. In addition, the oscillating signal at input node XA may be directly used (i.e., without buffering) as a modulating sinusoidal signal. Buffer 702 amplifies the output oscillating signal and isolates other circuitry implemented using standard transistors from input node XA. Accordingly, oscillator 700 does not include any gate terminals of any standard transistors (i.e., thin gate oxide transistors) directly coupled to input node XA, thereby increasing the electrostatic discharge protection of an integrated circuit using oscillator 700, while reducing jitter on the output oscillating signal.

Figure 9:
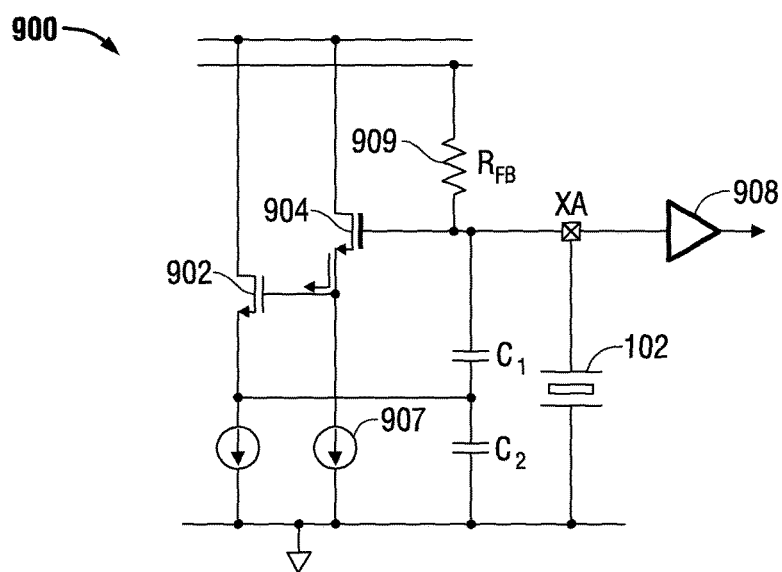
FIG. 9 illustrates a circuit diagram of a leakage-tolerant Colpitts oscillator circuit consistent with at least one embodiment of the invention.

In another embodiment of an oscillator circuit, the technique for reducing jitter in a clock generator output signal is implemented using a Colpitts architecture. Referring to FIG. 9, thick gate native transistor 904 is configured as a source follower coupled in series with standard transistor 902. Thus, standard transistor 902 is isolated from input node XA by thick gate native transistor 904. Any gate leakage current generated by standard transistor 902 flows to a bias node through thick gate native transistor 904 or through low impedance path 907, and not through feedback resistor 909.

The combination of thick gate native transistor 904 and standard transistor 902 requires less voltage headroom than a thick gate transistor. In addition, buffer 908, which is optional, may be formed from one or more thick gate transistor(s), which isolates other circuitry implemented using standard transistors (e.g., low-voltage transistors having thin gate oxide width) from input node XA. Further, the oscillating signal on input node XA may be directly used (i.e., without buffering) as a modulating sinusoidal signal. Accordingly, oscillator 900 does not include any gate terminals of standard transistors directly coupled to input node XA, thereby increasing the electrostatic discharge protection of an integrated circuit using oscillator 900.

The use of different types of transistors (e.g., thick gate native transistors, standard transistors, thick gate transistors) in a single integrated circuit product may result in process variations that affect each type of transistor differently, thereby causing corresponding variations in oscillator amplitude and duty cycle variations. A technique for compensating for such variations includes calibration performed during production test or other post integrated circuit fabrication phase.

Figure 10:
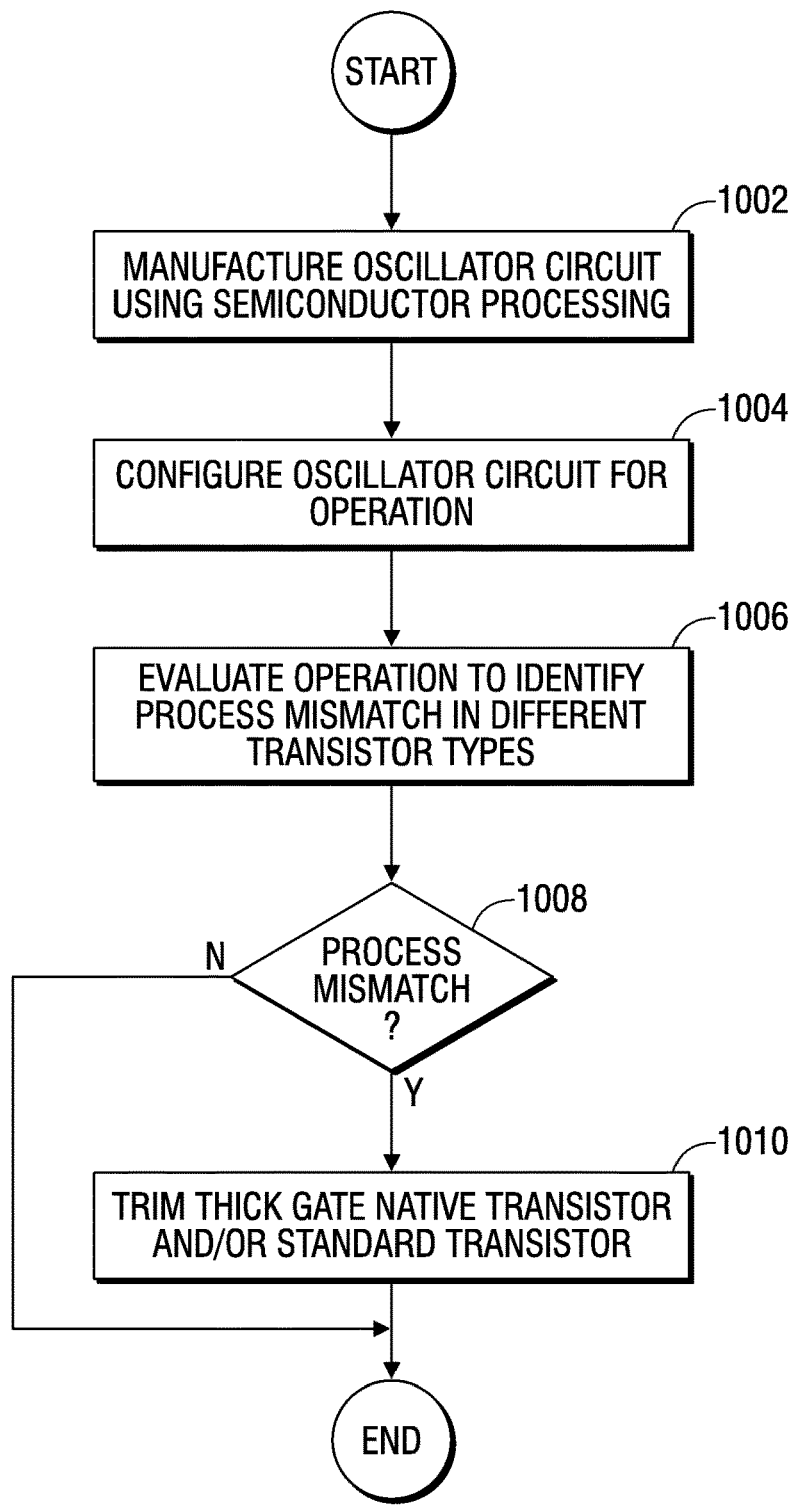
FIG. 10 illustrates an exemplary information and control flow for a method of manufacturing oscillator circuits of FIGS. 7, 8, and 9 consistent with at least one embodiment of the invention.

Referring to FIG. 10, a circuit consistent with techniques described above may be manufactured using typical semiconductor device fabrication processes (e.g., one or more steps during which an integrated circuit is created on a semiconductor substrate using diffusion, implant, lithography, etch, or other suitable integrated circuit manufacturing techniques) (1002). During production test, the circuit may be configured for operation, which may include coupling a crystal or other reference oscillator to input node XA and output node XB and providing appropriate bias and startup signals (1004). In other embodiments of the manufacturing technique, the circuit may be configured for operation in a bare die configuration using appropriate bias and startup signals, but without coupling a reference oscillator to input node XA and output node XB. During operation of the oscillator circuit, which may be with or without coupling a crystal or other resonator to input node XA and output node XB, effects of process mismatches on the different transistor types may be identified, e.g., using on-chip or off-chip voltage sensing and/or duty cycle measurement techniques. The sensed voltages and/or duty cycle measurements may then be used to identify any actual transistor mismatches associated with the different types of transistors (1006).

For example, measurements of the DC voltage level on input node XA of oscillator circuit 600 of FIG. 7 indicates the actual operating point of amplifier 602, which is a combination of the operating point of thick gate native transistor 608 and standard transistor 606. A replica circuit or information about the manufacturing processes may be used to identify the gate-to-source voltage of thick gate transistor 610. By comparing the DC level on input node XA to gate-to-source voltage of thick gate transistor 610, effects of process variations may be quantified.

Note that characteristics of the three different transistor types may vary differently with process variations. Ideally, buffer 604 slices the resulting oscillating signal at points of the oscillating signal that provide a maximum signal-to-noise ratio. However, due to process variations, buffer 604 may not have a threshold voltage that matches the sum of the threshold voltages of standard transistor 606 and thick gate native transistor 608 and causes buffer 604 to slice the oscillating signal at a point of the oscillating signal that degrades the signal-to-noise ratio. To ensure that the slicing threshold of buffer 604 is at or near the target slice point of the oscillating signal (i.e., at the point of the highest slope of the oscillating signal at input node XA, which is typically the average of the highest and lowest voltage levels of the signal), the calibration technique may include adjusting a width, a length, and/or a bias current, of the thick gate native transistor 608 so that the buffer circuit slices the oscillating signal at the appropriate instant of the oscillating signal period. The widths, lengths, and/or bias currents, of other transistors (e.g., the width and/or length of standard transistor 606 or a transistor used to generate a bias current in low impedance path 607) may be adjusted in addition to, or instead of, adjusting thick gate native transistor 608. The duty cycle of the oscillating signal generated on input node XA and output node XB may be used to determine a suitable adjustment (e.g. adjust the width and/or length of the thick gate native transistor that will increase symmetry of the oscillating signal to produce an output oscillating signal having a 50% duty cycle). This correction may be implemented by observing an average voltage of the buffered waveform produced by buffer 604 and using an off-chip or on-chip calibration loop to increase or decrease the voltage level on input node XA to increase or decrease the duty cycle of the output oscillating signal.

Referring back to FIG. 10, if process variations cause significant transistor mismatch (1008) then one or more of the transistors included in the oscillator circuit may be trimmed to adjust device parameters that reduce those effects of the process variations (1010). In general, since the greatest deviations from target design specifications in oscillator circuits result from process variations, dynamic calibration may not be necessary and calibration may be performed only during production test. In general deviations due to temperature variations cause the threshold voltages of the transistors in amplifier 602 and buffer 610 to decrease, the duty cycle variation caused by the difference in the different changes to the different threshold voltages in buffer 604 and amplifier 602 may be negligible compared to deviations due to process variations. However, in other embodiments of circuits implementing techniques described herein, dynamic circuit evaluation and calibration consistent with the techniques described herein may be performed periodically.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

Thus, techniques for reducing jitter in an oscillating signal generated by an oscillator circuit that reduce feedback of gate leakage current while increasing electrostatic discharge protection and reducing regulated power supply requirements of the oscillator circuit have been described. The description of the invention set forth herein is illustrative, and is not intended to limit the scope of the invention as set forth in the following claims. For example, while the invention has been described in embodiments using n-type thick gate native transistors formed in bulk p-type semiconductor (e.g., silicon) substrates, one of skill in the art will appreciate that the teachings herein can be adapted to complementary circuits formed using substrates with a complementary doping profile (e.g., a bulk n-type substrate which may be reversed biased) or using other semiconductor substrates (e.g., gallium-arsenide substrates). In addition, although the techniques for reducing jitter in a clock generator output signal disclosed herein are described with regard to fundamental modes of resonance of oscillator circuits, the techniques described herein may be adapted for use with overtone resonators (e.g., the amplifiers may use additional band pass filters in the oscillator circuit). Furthermore, while the invention has been described in an embodiment in which single-ended circuits are described, one of skill in the art will appreciate that the teachings herein can be adapted to circuits implementing differential signaling. Variations and modifications of the embodiments disclosed herein, may be made based on the description set forth herein, without departing from the scope of the invention as set forth in the following claims.

What is claimed is:

1. A circuit comprising:
   a first integrated circuit terminal;
   a feedback network;
   a thick gate native transistor of a first conductivity type having a first gate terminal having a first gate thickness, the first gate terminal being coupled to the first integrated circuit terminal and the feedback network, the thick gate native transistor having a first threshold voltage, the thick gate native transistor being configured as a source follower; and
   a second transistor of the first conductivity type having a second gate terminal with a second gate thickness less than the first gate thickness, the second gate terminal being coupled to a source terminal of the thick gate native transistor, the second transistor having a second threshold voltage, the second transistor having an amplifier configuration.

2. The circuit, as recited in claim 1, wherein a first magnitude of the first threshold voltage is less than a second magnitude of the second threshold voltage.

3. The circuit, as recited in claim 1, wherein the first threshold voltage has a magnitude of approximately zero volts.

4. The circuit, as recited in claim 1, wherein a first gate leakage current of the thick gate native transistor is less than a second gate leakage current of the second transistor.

5. The circuit, as recited in claim 1, wherein the second gate terminal is coupled to a low-impedance path to a bias node.

6. The circuit, as recited in claim 1, further comprising:
   a second integrated circuit terminal coupled to a drain terminal of the second transistor; and
   an oscillator circuit comprising:
      the feedback network, wherein the feedback network comprises:
         a resistor coupled between the first integrated circuit terminal and the second integrated circuit terminal; and
         a first capacitor coupled to the first integrated circuit terminal;
         a second capacitor coupled to the second integrated circuit terminal; and
      an amplifier circuit coupled between the first integrated circuit terminal and the second integrated circuit terminal, the amplifier circuit comprising the thick gate native transistor and the second transistor.

7. The circuit, as recited in claim 1, further comprising:
   a third transistor having a third gate terminal with a third gate thickness greater than the second gate thickness, the third transistor having a third threshold voltage, the third transistor being configured as a common source amplifier, the third gate terminal being coupled to the first integrated circuit terminal.

8. The circuit, as recited in claim 7, wherein the first threshold voltage has a magnitude of approximately zero volts, the second threshold voltage has a magnitude greater than approximately zero volts, and the third threshold voltage has a magnitude greater than the second threshold voltage.

9. The circuit, as recited in claim 7, further comprising:
   a buffer comprising the third transistor, the buffer being configured to provide an oscillating signal to a circuit comprising additional transistors having the second threshold voltage and having corresponding gate terminals with the second gate thickness.

10. The circuit, as recited in claim 1, further comprising:
    a second integrated circuit terminal; and
    an oscillator circuit comprising:
       the feedback network, wherein the feedback network comprises:
          a first capacitor coupled to the first integrated circuit terminal; and
          a feedback resistor coupled between an output of an inverter circuit and the first gate terminal;
       a second capacitor coupled to the second integrated circuit terminal;
       a resistor coupled between the second integrated circuit terminal and a drain terminal of the second transistor; and
       the inverter circuit, the inverter circuit being coupled to the resistor, the inverter circuit comprising the second transistor and an additional transistor of a second conductivity type having a third gate terminal coupled to the source terminal of the thick gate native transistor.

11. The circuit, as recited in claim 1, further comprising:
    an oscillator circuit comprising:
       the thick gate native transistor and the second transistor;
       the feedback network, wherein the feedback network comprises:
          a resistor coupled to the first gate terminal and a first bias node; and
          a first capacitor coupled to the first gate terminal of the thick gate native transistor and a source terminal of the second transistor; and
       a second capacitor coupled to the source terminal of the second transistor and a second bias node.

12. A method comprising:
    providing a signal, to a circuit including at least one transistor, based on a feedback signal and a first signal received from a first integrated circuit terminal, by a second circuit comprising a thick gate native transistor of a first conductivity type having a first gate terminal having a first gate thickness, the first gate terminal being coupled to the first integrated circuit terminal, the thick gate native transistor having a first threshold voltage, the thick gate native transistor being configured as a source follower, the at least one transistor having a second threshold voltage having a magnitude greater than a magnitude of the first threshold voltage, the at least one transistor being configured as an amplifier.

13. The method, as recited in claim 12, wherein the providing comprises:
  isolating a second transistor from the first integrated circuit terminal using the thick gate native transistor, the second transistor having a second gate terminal with a second gate thickness less than the first gate thickness, the second transistor having the second threshold voltage, and the second gate terminal being coupled to a source terminal of the thick gate native transistor.

14. The method, as recited in claim 13, wherein a first magnitude of the first threshold voltage is less than a second magnitude of the second threshold voltage and a first gate leakage current of the thick gate native transistor is less than a second gate leakage current of the second transistor.

15. The method, as recited in claim 13, wherein the second circuit is an oscillator circuit and the signal is a first oscillating signal, the method further comprising:
  calibrating the second circuit based on at least one of a duty cycle of a second oscillating signal on the first integrated circuit terminal and a DC voltage level on the first integrated circuit terminal.

16. The method, as recited in claim 15, wherein the calibrating comprises:
  measuring at least one of the duty cycle of the second oscillating signal on the first integrated circuit terminal and the DC voltage level on the first integrated circuit terminal; and
  adjusting a device parameter of at least one of the thick gate native transistor, the second transistor, and a third transistor based on the at least one of the duty cycle of the second oscillating signal on the first integrated circuit terminal and the DC voltage level on the first integrated circuit terminal.

17. The method, as recited in claim 13, further comprising:
  buffering the signal using at least a third transistor having a third gate terminal with a third gate thickness greater than the second gate thickness, the third transistor having a third threshold voltage, the third transistor being configured as a common source amplifier, the third gate terminal being coupled to the first integrated circuit terminal.

18. The method, as recited in claim 17, wherein the first threshold voltage has a magnitude of approximately zero volts, the second threshold voltage has a magnitude greater than approximately zero volts, and the third threshold voltage has a magnitude greater than the magnitude of the second threshold voltage.

19. A method of manufacturing a circuit comprising:
  forming a first integrated circuit terminal;
  forming a feedback network;
  forming a thick gate native transistor of a first conductivity type having a first gate terminal having a first gate thickness, the first gate terminal being coupled to the first integrated circuit terminal and the feedback network, the thick gate native transistor having a first threshold voltage, the thick gate native transistor being configured as a source follower; and
  forming a second transistor of the first conductivity type having a second gate terminal with a second gate thickness less than the first gate thickness, the second gate terminal being coupled to a source terminal of the thick gate native transistor, the second transistor having a second threshold voltage, the second transistor having an amplifier configuration.

20. The method, as recited in claim 19, wherein the thick gate native transistor and the second transistor are formed in an oscillator circuit configured to generate an oscillating signal on the first integrated circuit terminal, the method further comprising:
  calibrating the oscillator circuit based on at least one of a duty cycle of the oscillating signal on the first integrated circuit terminal and a DC voltage level on the first integrated circuit terminal.

* * * * *